United States Patent [19]

Bartholomew et al.

[11] Patent Number: 4,834,020

[45] Date of Patent: May 30, 1989

[54] ATMOSPHERIC PRESSURE CHEMICAL VAPOR DEPOSITION APPARATUS

[75] Inventors: Lawrence D. Bartholomew, Santa Cruz; Nicholas M. Gralenski, Aptos; Michael A. Richie, Santa Cruz; Michael L. Hersh, Boulder Creek, all of Calif.

[73] Assignee: Watkins-Johnson Company, Palo Alto, Calif.

[21] Appl. No.: 128,806

[22] Filed: Dec. 4, 1987

[51] Int. Cl.[4] .................. C23C 16/46; C23C 16/54
[52] U.S. Cl. .................. 118/719; 118/715; 118/725; 118/729
[58] Field of Search .............. 118/719, 715, 729, 725

[56] References Cited

U.S. PATENT DOCUMENTS 4,131,659 12/1978 Autnier et al. .................. 264/25

FOREIGN PATENT DOCUMENTS 54-101840 6/1984 Japan .................. 118/715

Primary Examiner—Evan Lawrence
Attorney, Agent, or Firm—Flehr, Hohbach, Test, Albritton and Herbert

[57] ABSTRACT

A conveyorized atmospheric pressure chemical vapor deposition apparatus having a heated muffle and a conveyor belt for conveying objects to be coated through said muffle. At least one chemical vapor deposition zone is provided in the muffle. An injector assembly is also provided for uniformly injecting first and second reactant gases in the deposition zone across the width of the conveyor belt and against the surfaces of the objects to be coated. The gases exit from slots connected to distribution plenums. Polished cooled surfaces are used on the injector assembly to minimize deposition of chemicals thereon.

5 Claims, 5 Drawing Sheets

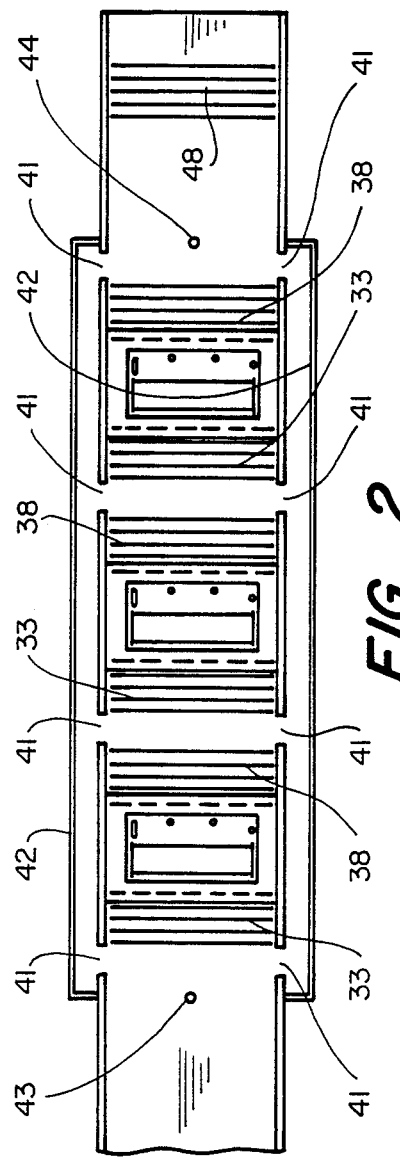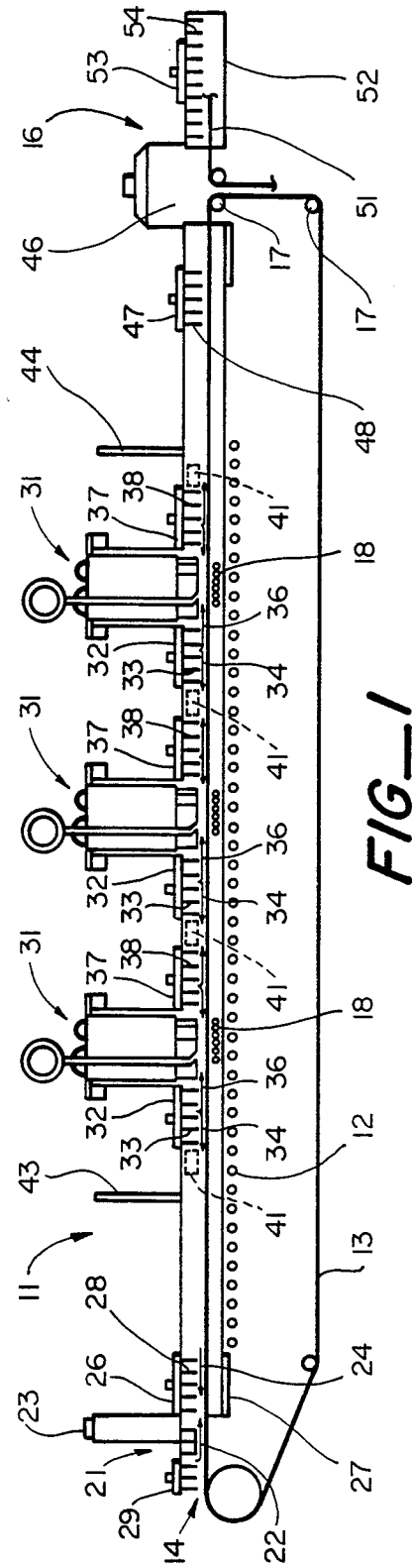

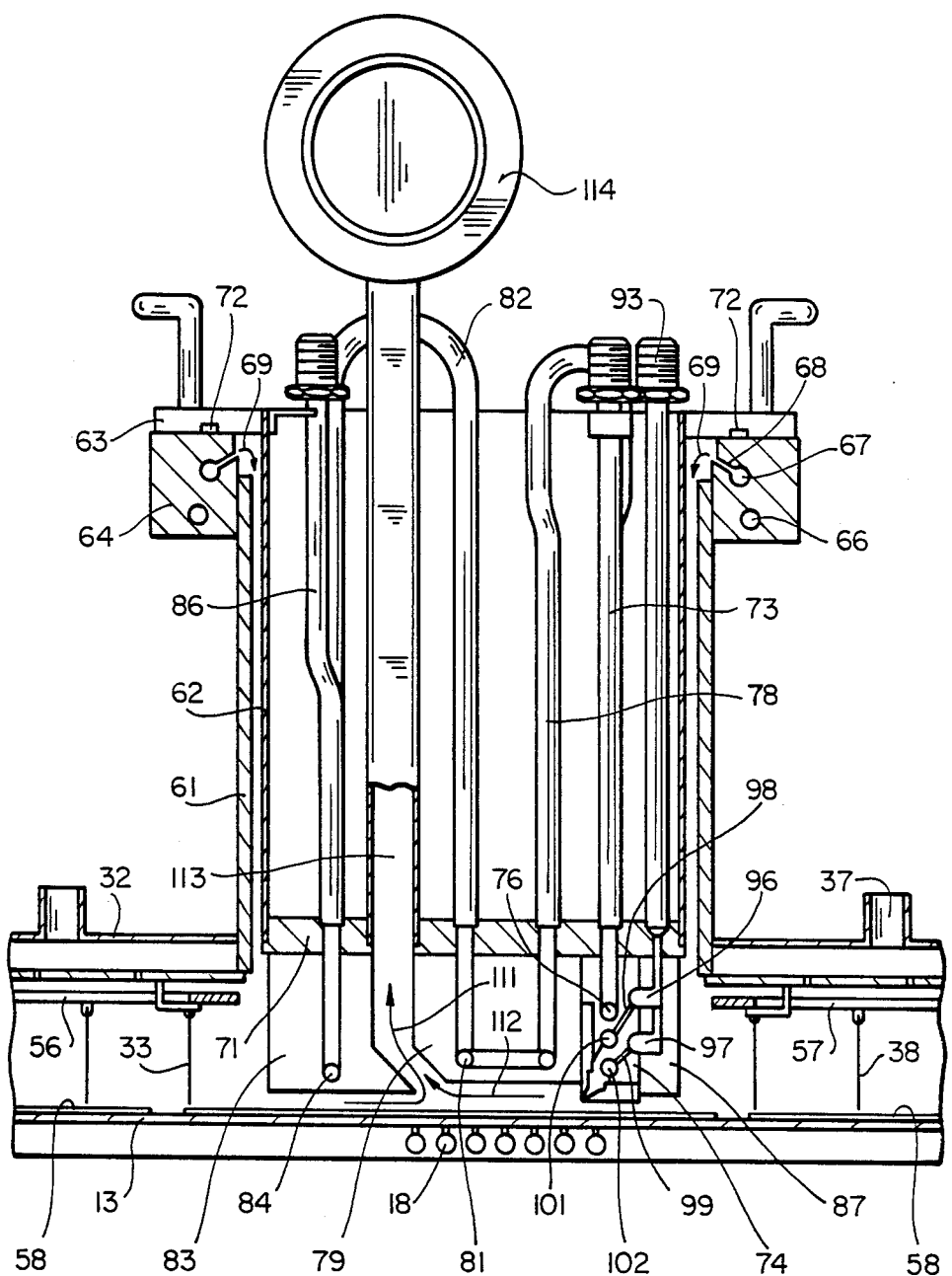
FIG_3

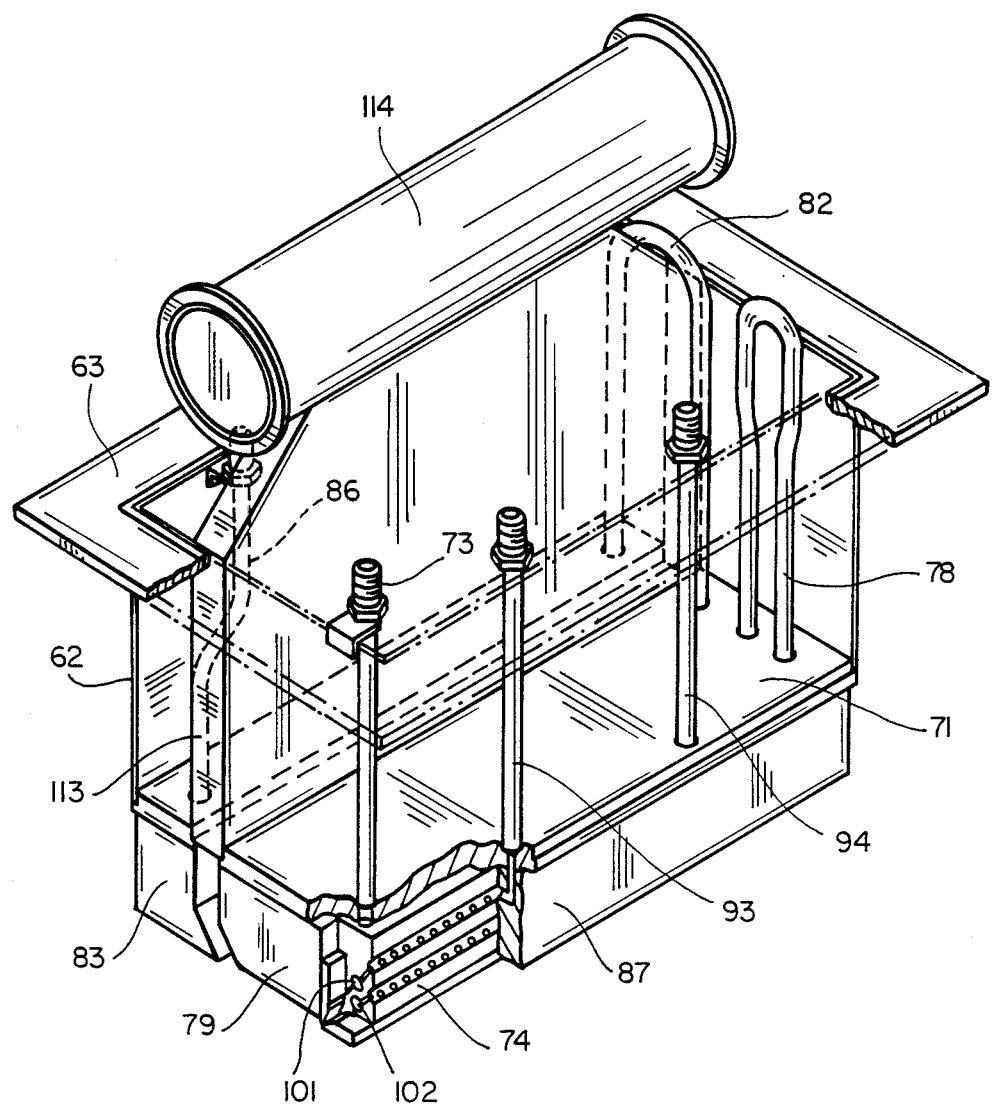
FIG_4

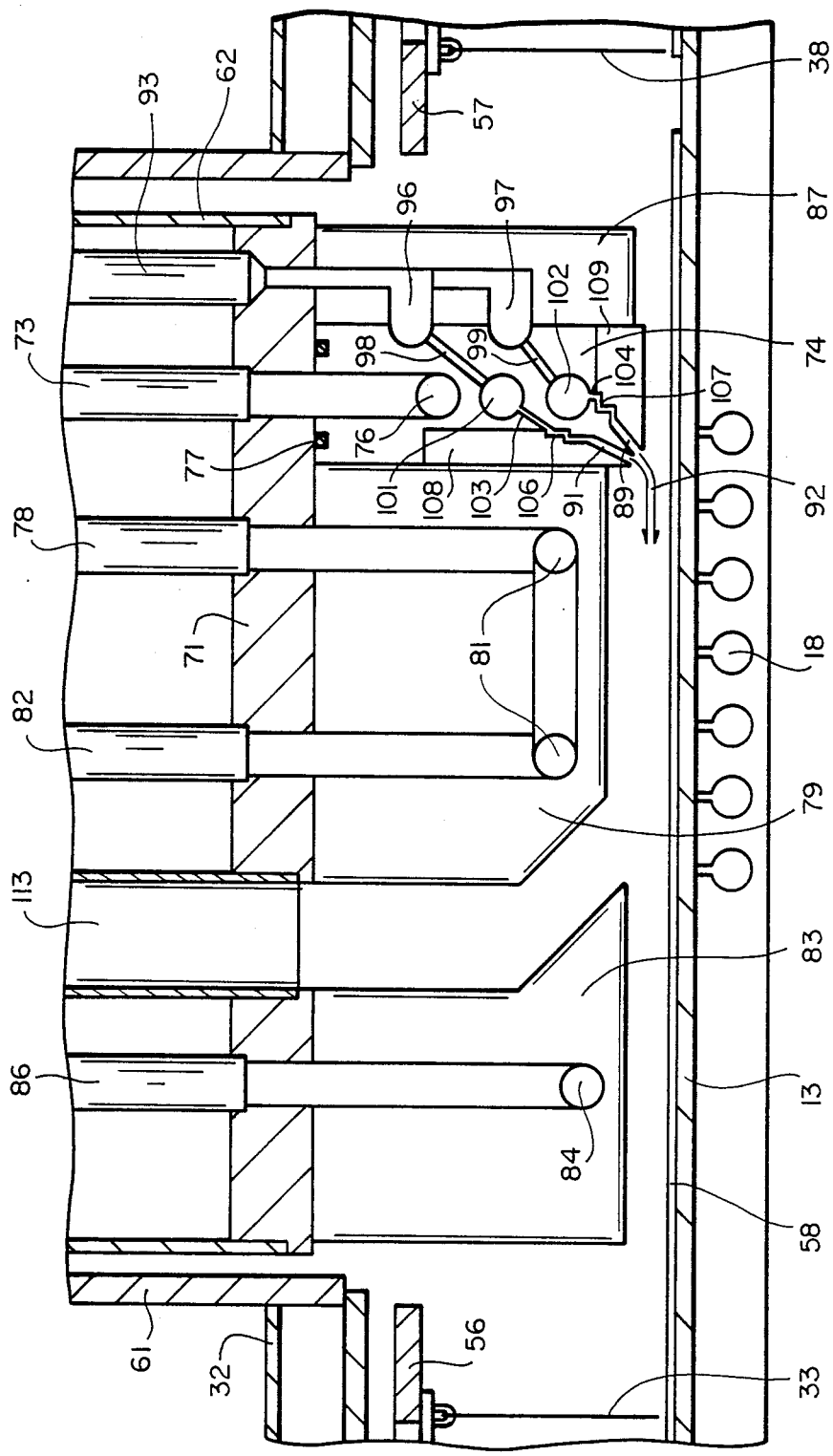
FIG_5

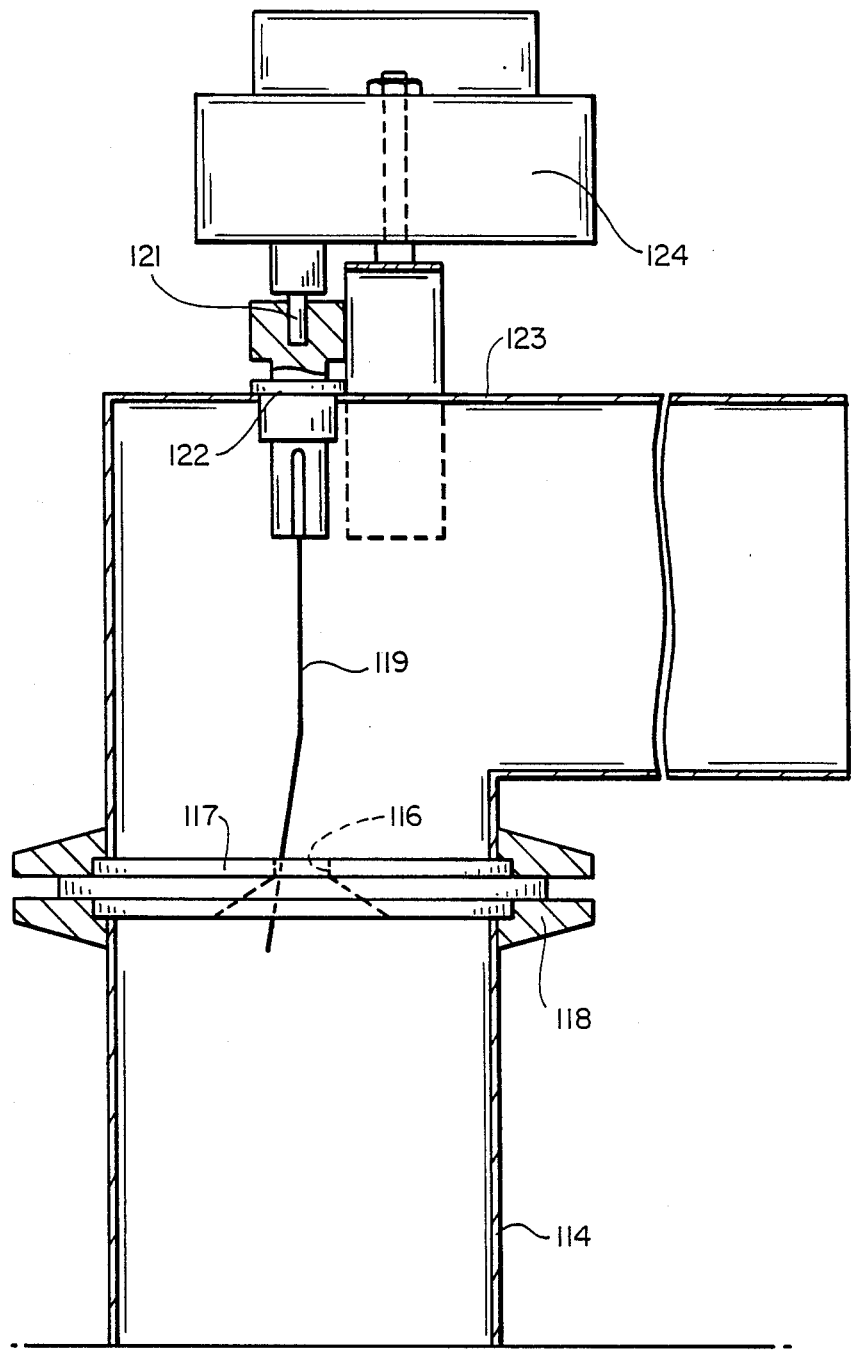
FIG_6

ATMOSPHERIC PRESSURE CHEMICAL VAPOR DEPOSITION APPARATUS

This invention relates generally to an atmospheric pressure chemical vapor deposition apparatus and more particularly to such apparatus particularly suitable for deposition of non-oxide films on substrates or wafers.

Apparatus for producing oxide coatings by in-line conveyorized atmospheric pressure chemical vapor deposition (APCVD) has been known for a number of years. Such equipment has been sold by Watkins-Johnson Company and has been described in a number of papers presented and published by Nicholas Gralenski.

In general the in-line APCVD apparatus of the prior art includes an endless belt which conveys the wafer or substrate to be coated through a muffle which includes one or more coating chambers. The coating chambers include means for creating and maintaining a chemical vapor atmosphere at the wafer surface where reaction of the chemical vapors takes place to form a deposited layer.

Such equipment has been found to be highly satisfactory for forming oxide coatings. However, because of poor atmosphere control due to pressure differentials, fluctuations in flow, or diffusion of oxygen into the deposition or coating chamber, reliable non-oxide coatings have not been achieved in prior art APCVD furnaces.

Furthermore, injection assemblies for injecting the gas or vapor mixtures into the coating chamber have not provided sufficient temperature control for efficient delivery of the reagent gases to the substrate surface and efficient removal of reactant gases from the coating chamber.

It is an object of the present invention to provide a conveyorized APCVD furnace suitable for reliably forming non-oxide films such as intrinsic or in-situ doped amorphous or polycrystalline silicon, tungsten silicide, selective or blanket tungsten, and silicon nitride on substrates such as silicon, glass, ceramic, or metal.

It is another object of the present invention to provide a furnace including a continuous conveyor system which excludes oxygen from reaction zones, and allows multistage processing which eliminates intervening air exposure and cleaning steps, thus enhancing yield and productivity.

It is another object of the present invention to provide a furnace including a continuous conveyor system which allows an in-situ etch of the substrate to remove native oxide and prevent its regrowth by maintaining the substrate in an atmosphere excluding oxygen throughout the deposition process.

It is another object of the present invention to provide a self-cleaning flowmeter device which accurately maintains a constant opening and thereby a constant flow of exhaust gases from the deposition chamber(s).

It is another object of the present invention to provide an injector assembly which provides continuous laminar flow across the width of the conveyor belt.

It is a further object of the present invention to provide an injector assembly which permits the control of chemical reactant vapors impinging upon the surface of a wafer.

These and other objects the inventor achieved by a conveyorized atmospheric pressure chemical vapor deposition apparatus of the type which includes a heated muffle, at least one chemical vapor deposition chamber or zone in said muffle, an injector assembly for introducing chemical vapors into said chambers and a conveyor belt for moving wafers to be coated through said muffle and vapor deposition chamber characterized in that means are provided for supporting and sealing the injector assembly on the vapor deposition chamber in spaced relationship to the walls of said chamber and means are provided for introducing a purge gas into the space between the injector assembly and the walls of the chamber. Said assembly also includes means for introducing chemical vapors across the width of conveyor belt and onto the surface of wafers carried by the belt and an exhaust system for removing the chemical vapors and purge gases from the deposition zone of the chamber.

The invention will be more clearly understood from the following description taken in connection with the accompanying drawings in which:

FIG. 1 is a schematic side elevational view of a atmospheric pressure chemical vapor deposition system in accordance with the present invention.

FIG. 2 is a schematic top plan view of the system of FIG. 1.

FIG. 3 is a side elevational view, in partial section, of an injector assembly for use in the system of FIG. 1.

FIG. 4 is a perspective view partly in section and partly in phantom of the injector system shown in FIG. 3.

FIG. 5 is an enlarged view of the lower portion of FIG. 3.

FIG. 6 is a side view of the self-cleaning exhaust orifice design for removing the chemical vapors and purge gases from the system of FIG. 1.

Referring now particularly to FIGS. 1 and 2, the APCVD muffle-furnace assembly 11 is provided with bottom heating elements 12 which heat the interior of the muffle or furnace. A conveyor belt 13 extends from the load end 14 of the muffle to the end 16 and returns over rollers 17. The bottom of the muffle or furnace may include a plurality of passages 18 which includes holes which communicate with the underside of the conveyor belt 13 to permit inert gas to flow upwardly into the furnace through the belt 13 for the purposes to be presently described.

In accordance with the present invention, the furnace assembly includes a hydrogen fluoride (HF) injector assembly 21 which injects hydrogen fluoride and water vapor into the region as shown by the arrow 22. The hydrogen fluoride may be formed by bubbling nitrogen through an azeotropic mixture of hydrofluoric acid and deionized water maintained at room temperature. The hydrogen fluoride gas strikes the surface of a wafer carried by the belt and etches away any silicon oxide on the surface of the wafer. The oxide would inhibit the adhesion of tungsten silicide or other non-oxide material on the surface of the wafer.

An exhaust system 23 exhausts the hydrogen fluoride vapors as well as purge nitrogen traveling, as shown by the arrows 24, at the top and bottom of the muffle. The purged nitrogen enters through plenums 26, 27 which have a series of openings into the furnace to cause nitrogen to travel past the curtains 28. This flow precludes any etchant from traveling into the muffle. Nitrogen flowing through the plenum 29 at the load end precludes any etchant from traveling out of the system.

The apparatus as shown includes a plurality of deposition chambers 31 each of which is similarly constructed and includes an entry chamber nitrogen plenum 32 which causes nitrogen to flow downwardly through openings or holes past the curtains 33 in both directions as illustrated by the arrows 34, 36 associated with each of the entry plenums. Exit plenums 37 are provided and likewise nitrogen or other inert gas flows past the curtains 38 in both directions.

In accordance with a feature of the present invention, openings 41 and plenum 42 are provided on the sides of the muffle or furnace into which the nitrogen may flow to equalize the pressure between the various chambers to assure undisturbed flow of chemicals and the elimination of oxygen in the deposition zones. Differential pressure ports 43 and 44 are provided to measure the differential pressure in the furnace.

An exit exhaust 46 is provided at the output end of the furnace. An exhaust nitrogen plenum 47 includes curtain 48. Nitrogen flows past the curtain 48 into exhaust 46. The wafers are transferred to a second conveyor belt 51 where they travel through a cooling muffle 52 which includes a nitrogen plenum 53 and curtains 54.

A wafer on the conveyor belt 13 travels sequentially through the hydrogen fluoride etch then first, second, and third deposition chambers, outwardly past the exit end of a muffle and into a cooling muffle from which the cooled wafers with the deposited film emerge.

The entry and exit plenums and associated curtains are more clearly illustrated in FIG. 3 where the curtains 33, 38 are shown depending from supports 56, 57 and extending closely to the surface of the conveyor belt 13 and particularly to the wafers 58 carried by the belt through the successive deposition chambers. The upright walls 61 of the muffle assembly form a rectangular box-like chamber which is adapted to receive an injector and vent assembly 62 for injecting deposition vapors into the deposition chambers 31 and removing the exhaust gases.

The injector assembly includes a support flange 63 which is adapted to rest upon flange support 64 carried at the upper end of the chamber walls. The support includes cooling coils 66 for receiving cooling water and ports 67 which receive nitrogen and inject it through openings 68 into the space between the walls 62 of the injector assembly and the upwardly extending walls 61 of the chamber. The nitrogen flows as indicated by the arrow 69 into the space between the injector assembly and walls of the chamber and downwardly to cleanse the space therebetween and into the deposition chamber and towards the exhaust manifold to be presently described.

Referring to FIGS. 3, 4 and 5, the injector assembly includes a rectangular hollow box-like body 62 which receives the flange 63 at the top. Various tubes and conduits to be presently described extend downwardly within the box-like body. The upstanding walls of body are supported by base 71 which receives the tubing for the gas inlets and water inlets and outlets. Referring particularly to FIG. 3, sealing flange 63 is suitably affixed to the body 71. O-ring seal 72 seals the injector assembly to the support 64. The conduit 73 brings cooling water through the base 71. The injector 74 includes a cooling passage 76 and is sealed to the base 71 by o-ring 77. The passage 76 is connected to conduit 78. The conduit 78 connects to the injector ceiling block 79 which includes cooling passages 81 which connect to conduit 82. The end ceiling block 83 has passage 84 which is connected to conduit 82 and to the outlet conduit 86.

The injector assembly includes means for injecting chemical vapors onto a wafer. The assembly includes blocks 87 and body 74 sealed to the base by o-rings and which include plenums and passages for directing vapors toward the wafer. More particularly the vapors are injected through passages 89 and 91 formed on either side of the tip of injector body 74 as shown by the arrows 92. The reactant gases flow at a steady rate regulated by mass flow controllers through slots 91 and 89 into the coating chamber. The gases traveling through the slots 89 and 91 are introduced at the conduits 93 and 94 and flow into the primary distribution plenums 96 and 97 respectively. The plenums are in the form of elongated openings defined by a groove formed in the member block 74 and a slot or groove formed in the block 87. Openings 98 and 99 in the grooves form the primary metering holes which lead to secondary plenums 101 and 102. A plurality of spaced openings or ports 103 and 104 form the secondary metering holes which extend downwardly from plenums 101, 102 and communicate with the elongated third plenum passages 106, 107. The gases then feed through a continuous slot formed by a uniform gap between the tip of the injector body 74 and the metering blocks 108 and 109. The metering blocks 108, 109 thus eliminate individual gas flow jets exiting the secondary metering holes 103, 104 and create a smooth laminar flow exiting across the full width of the injector through passages 89 and 91.

Both the top port flow 91 and bottom port flow 89 are directed in a laminar path from the tip of the injector body onto the heated surface of the substrate or wafer where the gases combine to react and form a deposited film.

The block members 79 and 83 define an elongated opening or slot which serves as an exhaust for removing nitrogen exhausted upwardly as shown by the arrow 111 and reactive gases and nitrogen as shown by the arrow 112. The exhaust slot communicates with passage 113 connected to exhaust tube 114.

This injector design used in an atmospheric pressure CVD system provides for the efficient and uniform reaction of the gases to form a film on the surface of the substrate. The chemicals are reacting in a deposition zone extending from the injector gas outlet underneath the injector ceiling to where the gases exit into the exhaust plenum.

It is important to minimize the deposition of the chemicals on the injector, the injector ceiling 79 and the end ceiling 83 to reduce particle incorporation and extend coating longevity. There are several mechanisms which prevent this reaction. The injector an ceiling components in the deposition chamber are made from aluminum so that the cooling medium is as effective as possible in uniformly cooling the structure. The surface is highly polished to provide a smooth surface to reduce adhesion of the reactants and to increase the infrared reflection. The top port flow where possible (dependent on the specific process) will be an inert gas which provides a laminar flow over the ceiling. This buffer flow also directs the gases onto the substrate longer for greater efficiency.

The gas phase reaction of the injected gases prior to their arrival at the surface of the substrate is minimized by several design features to enhance the film quality and reaction efficiency. The gases are kept cold and in a laminar flow path to the point of reaction at the substrate surface. A low concentration of chemicals can be used since the substrate is in close proximity to the injector and atmospheric pressure operation yields high deposition rates. The laminar flow allows control such that mixing occurs on the heated substrate rather than in the gas stream. The incorporation of reactants into the film is directly controlled by the precise gas delivery. The design of the vent assembly prevents the entry of oxygen into the reaction area through the use of o-ring seals and purge gas flows. The deposition zone is a small area streamlined to allow continuous input of fresh chemical and uniform exhaust of the reaction products not deposited on the substrate.

Typical non-oxide films that may be deposited in this manner at a conveyor belt speed of 6 inches per minute use the following nominal reagent gas flows in each of three chambers. A 5000 Angstrom thick film of amorphous silicon may be deposited at a temperature of 570 degrees C. using a bottom port flow of 30 sccm of disilane ($Si_2H_6$) in 0.75 slm of nitrogen and a top port flow of 0.25 slm of nitrogen. An in-situ phosphorus doped silicon film would be deposited by adding a flow of 0.9 sccm phosphine ($PH_3$) into the bottom port. A 2500 Angstrom thick film of tungsten silicide ($WSi_{2.4}$) may be deposited at a temperature of 360 degrees C. using a bottom port flow of 27 sccm silane ($SiH_4$) in 6 slm hydrogen and 2 slm nitrogen and a top port flow of 9 sccm tungsten hexafluoride ($WF_6$) in 1 slm hydrogen and 1 slm nitrogen. A 4000 Angstrom thick film of tungsten may be deposited at a temperature of 450 degrees C. using a bottom port flow of 3 slm hydrogen and 2 slm nitrogen and a top port flow of 21 sccm tungsten hexafluoride in 2 slm nitrogen. A 1500 Angstrom thick film of silicon nitride ($Si_3N_4$) may be deposited at a temperature of 750 degrees C. using a bottom port flow of 6 sccm silane ($SiH_4$) in 1 slm nitrogen and a top port flow of 160 sccm ammonia in 0.5 slm nitrogen.

The gases are exhausted at a uniform rate across the width of the deposition zone. This provides the proper residence time of the reacting chemicals over the substrate surface. A self-cleaning flowmeter device is used to accurately regulate the exhaust gas flows.

The consistent uniform exhaust of the reactant gases from the coating chamber is required to ensure that they are used efficiently while not forming gas phase nucleated particles. When the chamber is exhausted too quickly it results in a loss of deposition. If exhausted too slowly, the gas flows are undefined, resulting in particle generation. The exhaust must not change over time, or substrate to substrate uniformity and particle control will vary.

There is provided a metering device which is connected to the exhaust 114. The design of this metering device allows the reactant products, which would normally plug a fixed orifice, to be removed continuously. Referring to FIG. 6, an opening or orifice 116 is formed in a circular plate 117 sealed in an O-ring flange 118. A wire 119 is mounted on a motor shaft 121 which is appropriately sealed by a spring-loaded flange seal 122 to the exhaust duct tube 123. A motor 124 rotates the wire along the axis of the hole 116. The wire 119 is bent such that it continuously sweeps the entire circumference of the orifice 116 at a constant speed. Any deposited material is scraped off and exhausted away. In this fashion an orifice of constant cross-section is maintained, across which the pressure drop from an exhaust blower can be measured and maintained to yield a constant flow of exhaust gases.

Deposition will occur to some degree on the backside of the substrate. To minimize the opportunity of this occurring, two mechanisms are employed. The conveyor belt is very densely woven, presenting a nearly solid surface in contact with the backside of the substrate. Nitrogen is diffused through the densely woven belt from the nitrogen purge 18 in the floor of the coating chamber. The nitrogen pressures the area on the backside of substrate and flows upwards around the perimeter. This minimizes the flow of the reactant gases in this area.

The benefit of this design is the reduction of particles and the elimination of the need to do a post-deposition cleanup or etch of the substrate backside.

We claim:

1. A conveyorized atmospheric pressure chemical vapor deposition apparatus of the type including a heated muffle, at least one chemical vapor deposition chamber in said muffle, an injector assembly for introducing chemical vapors into said chamber, and a conveyor belt for moving wafers to be coated through said muffle and vapor deposition chamber, characterized in that said apparatus comprises means for supporting said injector assembly on said vapor deposition chamber in spaced relationship to the walls of said chamber, sealing means cooperating between the injector assembly and the support means for providing a seal therebetween, means for introducing a purge gas into the space between said injector assembly and chamber walls, said injector assembly including means for introducing chemical vapors across said conveyor belt and directed to the surfaces of a wafer carried by the belt for reaction at the surface of the wafer, said injector assembly comprising at least first and at least a second distribution plenum means for receiving and distributing first and second gases, first and second elongated flow slots extending across said injector for directing the vapors to the surface of a wafer traveling past the slots, and spaced ports communicating between said first and second plenum means and said first and second slots respectively, and exhaust means extending across the belt for removing the chemical vapors and purge gas from the deposition zone of the deposition chamber.

2. A conveyorized atmospheric pressure chemical vapor deposition apparatus as in claim 1 wherein said distribution plenum means include first and second plenum stages and a plurality of ports interconnecting said first and second plenum stages.

3. A conveyorized atmospheric pressure vapor deposition apparatus as in claim 1 in which said injector assembly includes polished cooled surfaces facing said conveyor belt to minimize deposition on the surface of the injector assembly.

4. An injector assembly for a conveyorized atmospheric pressure chemical vapor deposition apparatus including a base, a vapor distribution plenum and injector assembly carried by said base, said assembly comprising first and second spaced primary plenums for receiving vapors to be injected into a deposition zone, first and second secondary plenums, a plurality of ports communicating between said first and second primary and secondary plenums to distribute vapors into said secondary plenums, first and second spaced injector slots for injecting vapors into said deposition zone, a plurality of ports extending between the first and second secondary plenums and said first and second slots to provide the injection of uniform sheets of vapor into said reaction zone, and an exhaust slot spaced from said plenum and injector assembly to exhaust vapors from said reaction zone.

5. A conveyorized atmospheric pressure chemical vapor deposition apparatus of the type including a heated muffle, at least one chemical vapor deposition chamber in said muffle, an injector assembly for introducing chemical vapors into said chamber, and a conveyor belt for moving wafers to be coated through said muffle and vapor deposition chamber, characterized in that said apparatus comprises means for supporting said injector assembly on said vapor deposition chamber in spaced relationship to the walls of said chamber, sealing means cooperating between the injector assembly and the support means for providing a seal therebetween, means for introducing a purge gas into the space between said injector assembly and chamber walls, said injector assembly including means for introducing chemical vapors across said conveyor belt and directed to the surfaces of a wafer carried by the belt for reaction at the surface of the wafer, polished cooled surfaces facing said conveyor belt to minimize deposition on the surface of the injector assembly, and exhaust means extending across the belt for removing the chemical vapors and purge gas from the deposition zone of the deposition chamber.

* * * * *